United States Patent [19]
Nelson et al.

[11] Patent Number: 6,073,264
[45] Date of Patent: Jun. 6, 2000

[54] DEBUG VECTOR LAUNCH TOOL

[75] Inventors: Mark B. Nelson, Folsom; Richard F. Clark, Roseville; Ken R. Watrobski, Shingle Spring, all of Calif.

[73] Assignee: Intel Corporation, Santa Clara, Calif.

[21] Appl. No.: 09/053,936

[22] Filed: Apr. 2, 1998

[51] Int. Cl.$^7$ .................................................. G01R 31/28
[52] U.S. Cl. ...................... 714/738; 714/735; 714/736; 702/67
[58] Field of Search .................................. 714/738, 718, 714/724, 735, 740, 744, 743, 732, 736; 324/121 R, 158.1, 111, 76.11, 73.1

[56] References Cited

U.S. PATENT DOCUMENTS

| | | | |
|---|---|---|---|
| 5,289,116 | 2/1994 | Kurita et al. | 324/76.11 |
| 5,412,662 | 5/1995 | Honma et al. | 714/718 |
| 5,463,639 | 10/1995 | Koishi et al. | 714/740 |
| 5,508,607 | 4/1996 | Gibson | 324/121 R |
| 5,731,984 | 3/1998 | Ullmann | 702/67 |
| 5,854,804 | 12/1998 | Winer et al. | 372/38 |

*Primary Examiner*—Emmanuel L. Moise
*Attorney, Agent, or Firm*—Blakely, Sokoloff, Taylor & Zafman LLP

[57] ABSTRACT

The present invention discloses a debug tool to provide a test vector to a device under test. The debug tool comprises: (1) a pattern generator unit coupled to the device under test to transmit the test vector to the device under test and to generate a master triggering signal; (2) a waveform acquisition unit coupled to the device under test to receive a first test output from the device under test, the first test output being generated by the device under test in response to the transmitted test vector; and (3) a trigger unit coupled to the pattern generator unit, the waveform acquisition unit, and the device under test to synchronize the pattern generator unit, the waveform acquisition unit, and the device under test.

20 Claims, 7 Drawing Sheets

FIG_3

FIG. 5

FIG_6

FIG_7

DEBUG VECTOR LAUNCH TOOL

BACKGROUND OF THE INVENTION

1. Field of the Invention

This invention relates to device testing. In particular, the invention relates to a debug vector launch tool.

2. Description of Related Art

Testing of semiconductor devices typically involves applying test vectors to the device under test (DUT) and comparing the resulting outputs with the expected data. Sophisticated testers such as electron beam tester or microscope-based instrument allow the users to examine semiconductor device in detail. Although these testers provide useful test information, they present a number of problems in an engineering laboratory environment. First, they are expensive, and therefore, are not suitable in an engineering lab environment. Second, they are difficult to use, typically requiring some investment in training. Third, they are not flexible enough to allow the design engineers to focus on only one area of concern of the DUT.

During the design and manufacturing process, design engineers generally prefer to have a simple debugging tool to verify the performance of the device in the first production run to ensure that basic design parameters are met. For this objective, the use of sophisticated testers is not only an overkill, but also slows down the debugging process.

Therefore, there exists a need for an efficient and inexpensive debug tool to assist design engineers to perform device testing during the early phase of the production cycle.

SUMMARY OF THE INVENTION

The present invention discloses a debug tool to provide a test vector to a device under test. The debug tool comprises: (1) a pattern generator unit coupled to the device under test to transmit the test vector to the device under test and to generate a master triggering signal; (2) a waveform acquisition unit coupled to the device under test to receive a first test output from the device under test, the first test output being generated by the device under test in response to the transmitted test vector; and (3) a trigger unit coupled to the pattern generator unit, the waveform acquisition unit, and the device under test to synchronize the pattern generator unit, the waveform acquisition unit, and the device under test.

BRIEF DESCRIPTION OF THE DRAWINGS

The features and advantages of the present invention will become apparent from the following detailed description of the present invention in which.

DESCRIPTION OF THE PRESENT INVENTION

The present invention discloses a method and apparatus for providing debugging information to the user. The apparatus comprises a pattern generation unit, a waveform acquisition unit, a trigger unit, and a host processor. The apparatus provides test vectors to the device under test (DUT) and receives an output from the DUT or a signal acquisition instrument. The system evaluates the test results by comparing the output with the simulated data from a design file.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
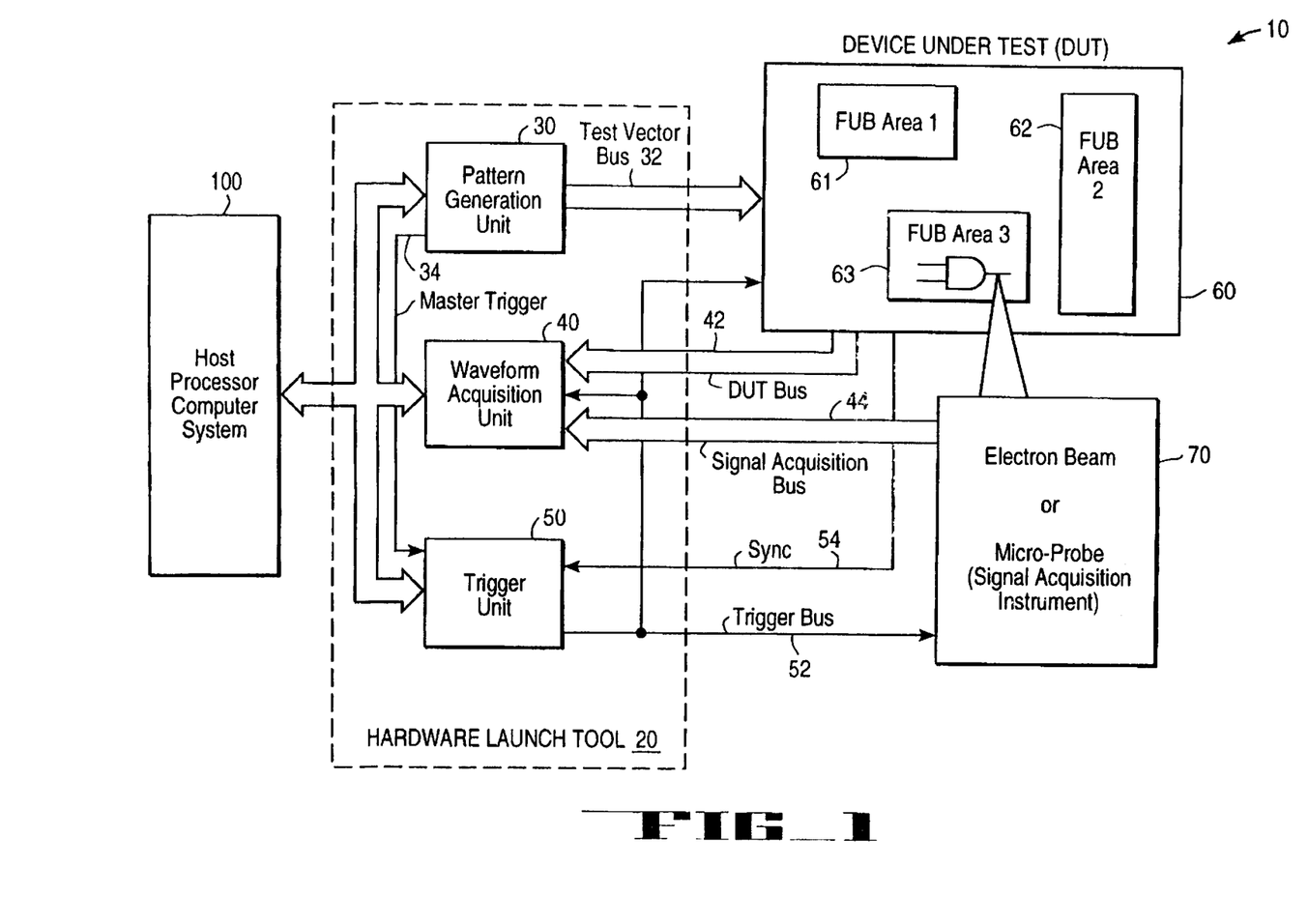
FIG. 1 is a diagram illustrating one embodiment of a system in accordance with the teachings of the present invention.

Referring to FIG. 1, an illustrative embodiment of a system 10 utilizing the present invention is shown. The system 10 comprises a host processor computer system 100, a hardware launch tool 20, a device under test (DUT) 60, and a signal acquisition instrument 70. In this embodiment, the signal acquisition instrument 70 is optional.

The host processor computer system 100 provides means to allow the user to interact and control the hardware launch tool 20. The host processor computer system 100 will be described later.

The hardware launch tool 20 provides test vectors to the DUT 60 and obtains test results from the DUT 60 or the signal acquisition instrument 70. The hardware launch tool 20 comprises a pattern generation unit (PGU) 30, a waveform acquisition unit (WAU) 40, and a trigger unit (TU) 50. The PGU 30 provides test vectors to the DUT 60 over a test vector bus 32. The WAU 40 receives the test output from the DUT 60 over a DUT bus 42, and optionally the FUB output from the signal acquisition instrument 70 over the tester bus 44. The TU 50 generates the triggering clock signals to the PGU 30, the WAU 40, the DUT 60, and the signal acquisition instrument 70. The TU also synchronizes the generation of clock signals by receiving a sync signal from the DUT 60. The PGU 30, the WAU 40, and the TU 50 will be described in more details later.

The DUT 60 is a device that is being debugged or tested. In one embodiment, the DUT is a packaged device. The DUT 60 comprises a number of functional unit block (FUB) areas. A "FUB area" refers to a section in the device that the design engineer wishes to test, debug, or verify the performance. The FUB area may be a simple gate or a circuit or even a large section of circuits. In the illustrative example shown in FIG. 1, the DUT 60 comprises a first FUB area 61, a second FUB area 62, and a third FUB area 63. As shown, the third FUB area 63 is being optionally examined by the signal acquisition instrument 70. The DUT 60 receives the stimuli test vectors from the PGU 30 via the test vector bus 32. After receiving the test vectors, the DUT 60 produces the outputs in response to the stimuli test vector. The outputs are obtained either in a parallel or serial format and fed to the WAU 40 via the DUT bus 42.

The signal acquisition instrument 70 is a test instrument that provides detailed information about the FUB areas during testing. In one embodiment, the signal acquisition instrument 70 may be an electron beam (E-beam) tool. The "E-beam tool" is an electron microscope that is modified to capture electronic signals on metal lines within the DUT and displays a time domain representation of them. The E-beam tool works in a similar manner as an oscilloscope which represents a voltage picked up by the scope probe. In another embodiment, the signal acquisition instrument 70 may be a microscopic probing (micro-probe) system. The "micro-probe" is an instrument used to probe small metal traces in an integrated circuit, normally including a needle point and cable used to transmit the signals to some type of signal acquisition instrument (like an oscilloscope or sample head).

Figure 2:
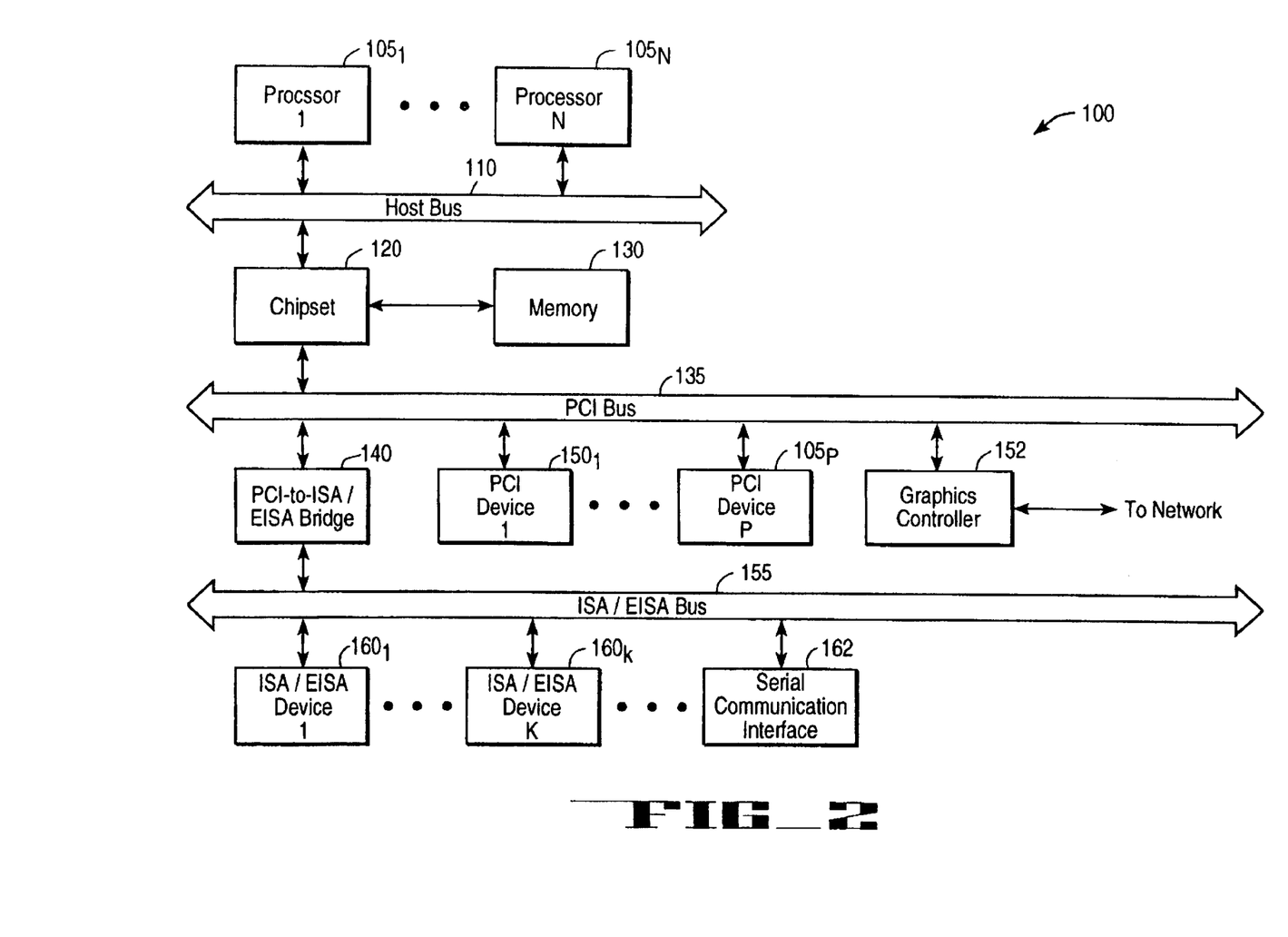
FIG. 2 is a diagram illustrating one embodiment of a host processor computer system that interfaces to the hardware elements of the debug tool.

Referring to FIG. 2, an illustrative embodiment of the host processor computer system 100 is shown. The computer system 100 comprises one or more processors $105_1$–$105_N$ ("N" being a positive whole number) and a main memory element 130 (e.g., dynamic random access memory "DRAM", static random access memory "SRAM" etc.) coupled together by a chipset 120. In general, the chipset 120 operates as an interface between a host bus 110 and a peripheral bus 135.

Processors $105_1$–$105_N$ are any microprocessors. In one embodiment, processors $105_1$–$105_N$ are the Pentium® or Pentium Pro® microprocessors manufactured by Intel Corporation at Santa Clara, Calif.

Chipset 120 typically includes a cache DRAM controller (CDC), a peripheral bus controller, and a data path unit (DPU). The Peripheral Component Interconnect (PCI) Bridge (PB) provides a set of host-to-PCI and PCI-to-host bus transaction translations.

The host bus 110 is a bus that can support transactions to a number of connected processors. Host bus 110 may be referred to as a parallel bus or multiprocessor bus because it supports parallel operations and multiple processors. It is contemplated that host bus 110 operates in a pipelined manner to increase efficiency. However, these features should not be construed to limit the teachings of the present invention. The present invention can be utilized if there is only one processor connected to the host bus 110.

The peripheral bus 135 provides a communication path between the processors $105_1$–$105_N$ or main memory element 130 and a plurality of peripheral devices $150_1$–$150_P$ ("P" being a positive whole number) and a network interface 152. These peripheral devices $150_1$–$150_P$ may include I/O devices such as disk controller and, video and imaging controllers. The network interface 152 provides access to a communication network such as local area network (LAN). The peripheral bus 135 may include a PCI bus or any other type of bus architecture.

The expansion bus 155 provides a communication path between the peripheral bus 135 and a plurality of expansion peripheral devices $160_1$–$160_K$ ("K" being a positive whole number). The expansion bus 155 may include an Industry Standard Architecture (ISA) bus or an Extended Industry Standard Architecture (EISA) bus. Additional devices may be interfaced to the expansion bus 155 such as a serial communication interface (SCI) 162.

In the present invention, the hardware launch tool 20 can be interfaced to the computer system 100 via the PCI bus 135, the ISA/EISA bus 155, or the SCI 162.

Figure 3:
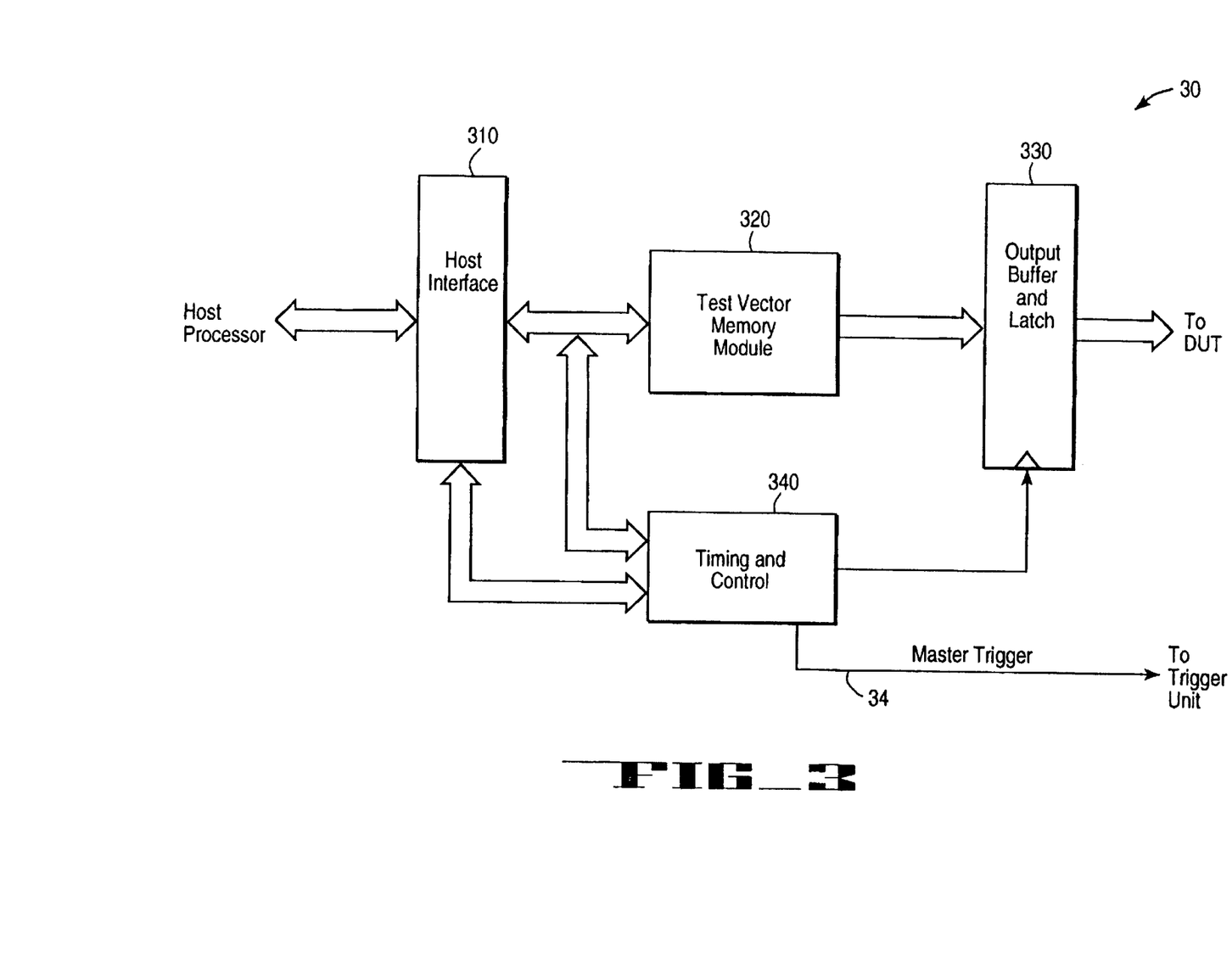
FIG. 3 is a diagram illustrating one embodiment of a pattern generator unit.

Referring to FIG. 3, a diagram illustrating one embodiment of the PGU 30 is shown. The PGU 30 comprises a host interface 310, a test vector memory module 320, an output buffer and latch 330, and a timing and control section 340.

The host interface 310 provides interface to the host computer system 100. The host interface 310 includes address decoding circuitry, address latches, and bidirectional data transceivers to allow the host computer system 100 to communicate with the PGU 30. The host interface 310 transfers data from the host computer 100 to the test vector memory module 320.

The test vector memory module 320 stores the patterns of test vectors. In one embodiment, the test vector memory module 320 is implemented with high speed static RAM devices. In another embodiment, the test vector memory module 320 is implemented with first-in-first-out (FIFO) devices. Yet, in another embodiment, the test vector memory module 320 is implemented with a register bank that stores one test vector. The test vectors stored in the test vector memory module 320 are downloaded from the host processor computer system 100. In the usual case, these test vectors are developed by the design engineer who has the full knowledge of the functionality of the DUT 60. The size of each test vector is dependent on the FUB test condition. In one embodiment, the number of bits of the test vector is approximately 1024. The number of test vectors may range from as few as 2 to as high as 5 million. The test vector bits are mapped to the output buffer and latch 330, to be hooked up to the DUT 60 pins.

The output buffer and latch 330 outputs the pattern of the test vector under the control of the timing and control section 340. The output buffer and latch 330 provides test signals with appropriate electrical and timing characteristics to drive the DUT 60.

The timing and control section 340 generates the clock and control signals to the test vector memory module 320 and the output buffer and latch 330. The timing and control section 340 generates the trigger signals for the TU 50. In one embodiment, the timing and control section 340 generates a master trigger signal 34. The master trigger signal 34 provides the master timing signal to the TU 50.

Figure 4:
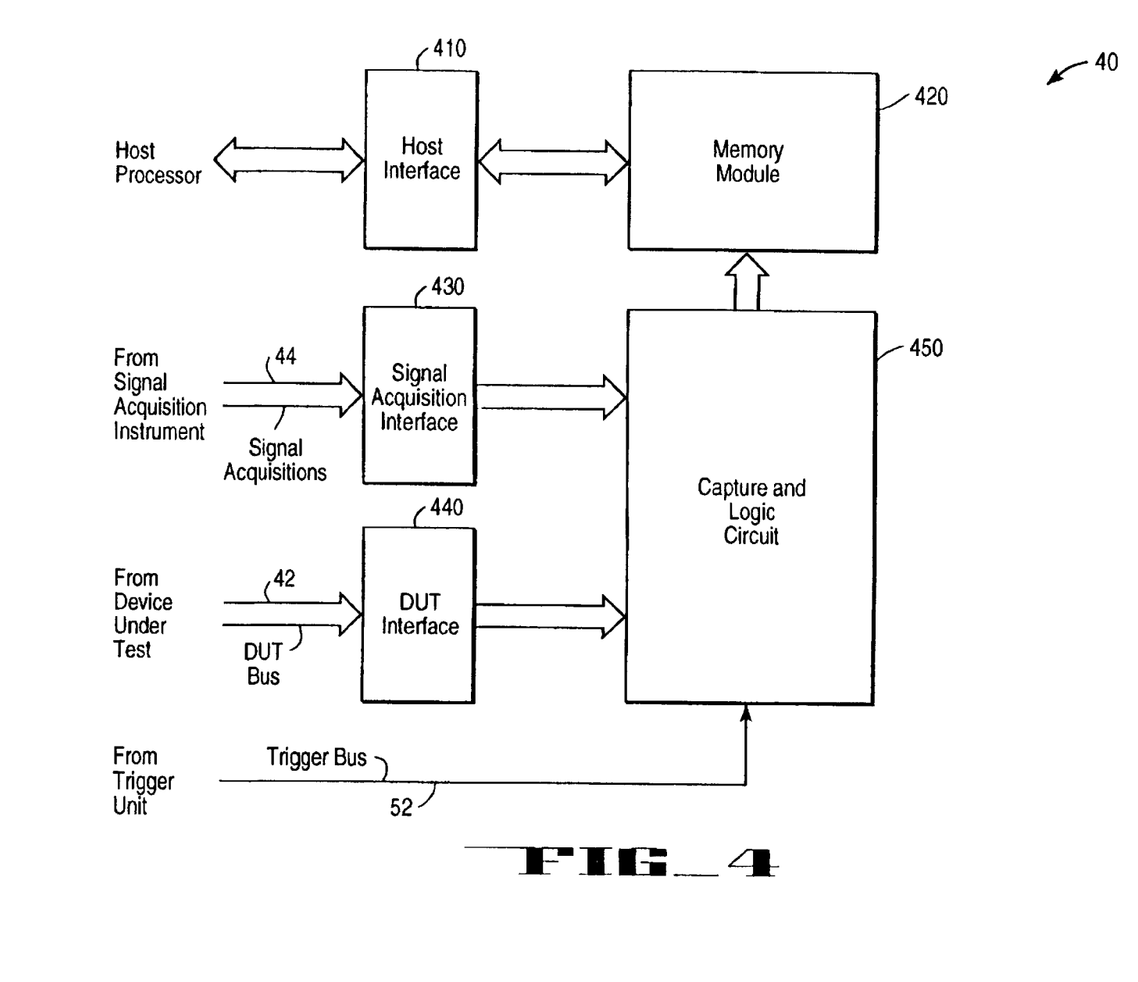
FIG. 4 is a diagram illustrating one embodiment of a waveform acquisition unit

Referring to FIG. 4, a diagram illustrating one embodiment of the WAU 40 is shown. The WAU 40 comprises a host interface 410, a memory module 420, a signal acquisition instrument interface 430, a DUT interface 440, and a capture and logic circuit 450.

The host interface 410 provides interface to the host computer system 100. The host interface 410 includes address decoding circuitry, address latches, and bidirectional data transceivers to allow the host computer system 100 to communicate with the WAU 40. The host interface 410 transfers data from the memory module 420 to the host computer 100.

The memory module 420 stores the captured and/or processed test output data from the DUT 60 and/or the signal acquisition instrument 70. In one embodiment, the memory module 420 is implemented with high speed static RAM. The size of the memory module 420 is large enough to store the captured data over a period of testing time. In one embodiment, the memory depth is approximately 16 Megawords with expandability.

The signal acquisition instrument interface 430 provides signal conditioning, signal selection, and buffering for the signal acquisition instrument 70 output signals. In one embodiment, the signal acquisition instrument 70 signals are high speed analog signals. The tester interface 430 provides appropriate filtering and amplifying for the analog signals. To select between various tester outputs, analog (for analog signals) or digital (for digital data) multiplexers are employed.

The DUT interface 440 provides signal conditioning and buffering for the DUT output signals to filter and/or amplify the signals.

The capture and logic circuit (CLC) 450 captures and processes the signals from the tester interface 430 and the DUT interface 440. In one embodiment, the capturing or acquisition rate is up to 20 gigahertz (GHz), To capture analog signals the CLC 450 includes a high speed sample-and-hold device and a high-speed analog-to-digital converter. The clocking of the sample-and-hold device and the analog-to-digital converter is derived from the triggering signals from the TU 50. For digital data, the CLC 450 includes a latching circuit that latch the data in response to the triggering signals via the trigger bus 52. In addition to capturing the signal acquisition instrument 70 and DUT output signals, the CLC 450 also performs logic functions to the captured data. The purpose of the logic operations is to facilitate the comparison of the design reference or simulated data and the signal acquisition instrument 70 data. Examples of these logic functions include OR, AND, and XOR. The CLC 450 writes the captured and/or processed data to the memory module 420.

Figure 5:
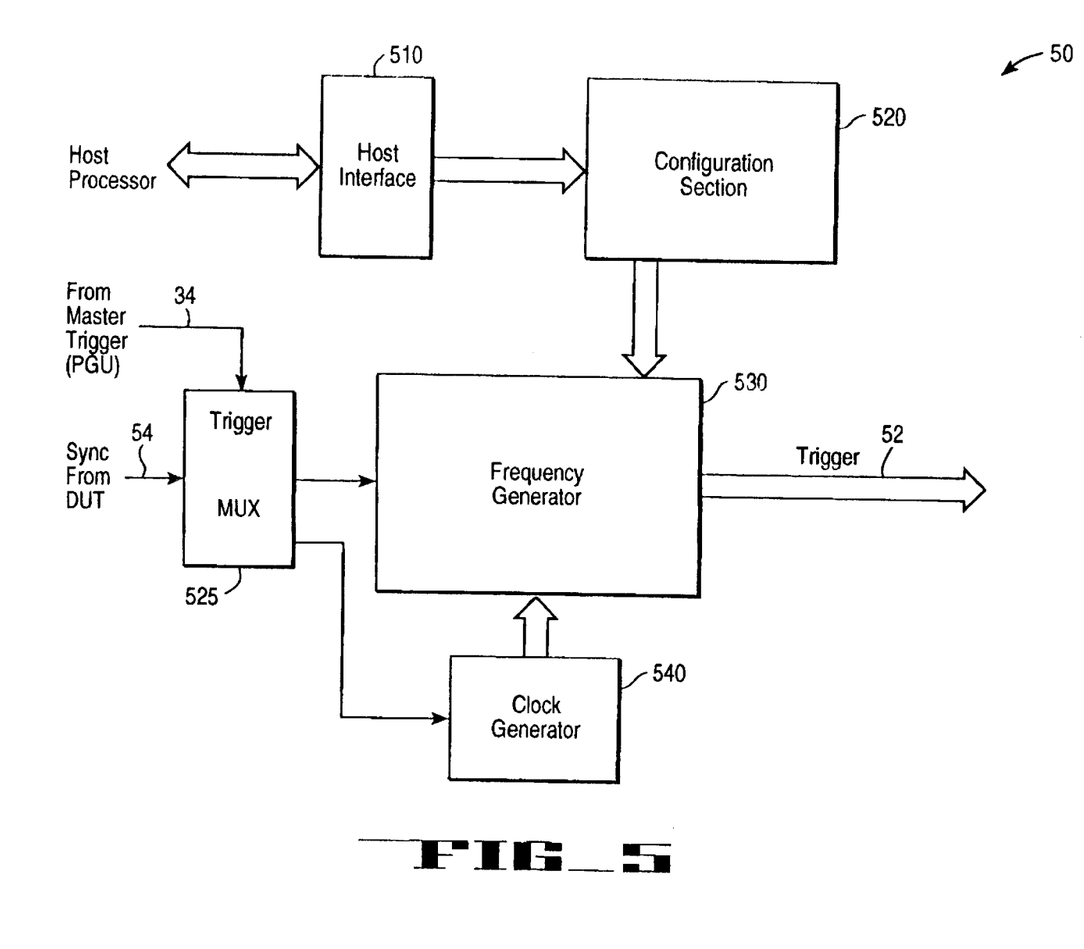
FIG. 5 is a diagram illustrating one embodiment of a triggering unit.

Referring to FIG. 5, a diagram illustrating one embodiment of the TU 50 is shown. The TU 50 comprises a host interface 510, a configuration section 520, a frequency generator 530, a trigger multiplexer 525 and a clock generator 540.

The host interface 510 provides interface to the host computer system 100. The host interface 510 includes address decoding circuitry, address latches, and bidirectional data transceivers to allow the host computer system 100 to communicate with the TU 50.

The configuration section 520 configures the triggering mode by latching a control word from the host computer system 100. Examples of triggering modes include an internal trigger and an external trigger. The internal trigger mode is the triggering mode initiated by the DUT 60 or the PGU 30. The external trigger mode is initiated by external sources such as an external frequency generator. The control word may also specify the frequency of the triggering signals.

The frequency generator 530 generates the triggering signals in response to the control word issued by the configuration section 520. The frequency generator 520 receives the sync signal via the sync bus 54 for synchronizing the triggering signals with the master clock from the DUT 60 or the master trigger signal 34 from the PGU 30 as selected by the trigger multiplexer 525. The frequency generator 530 generates the triggering signals via the trigger bus 52. In one embodiment, the frequency of the triggering signal is up to 1 GHz.

The clock generator 540 includes circuitry to generate appropriate basic clock signals. The clock generator 540 may include a phase-locked loop circuitry to synthesize a stable clock signal. The clock generator 540 may also synchronize the generated clock signal with the sync signal from the DUT 60 or the master trigger signal 34 from the PGU 30.

Figure 6:
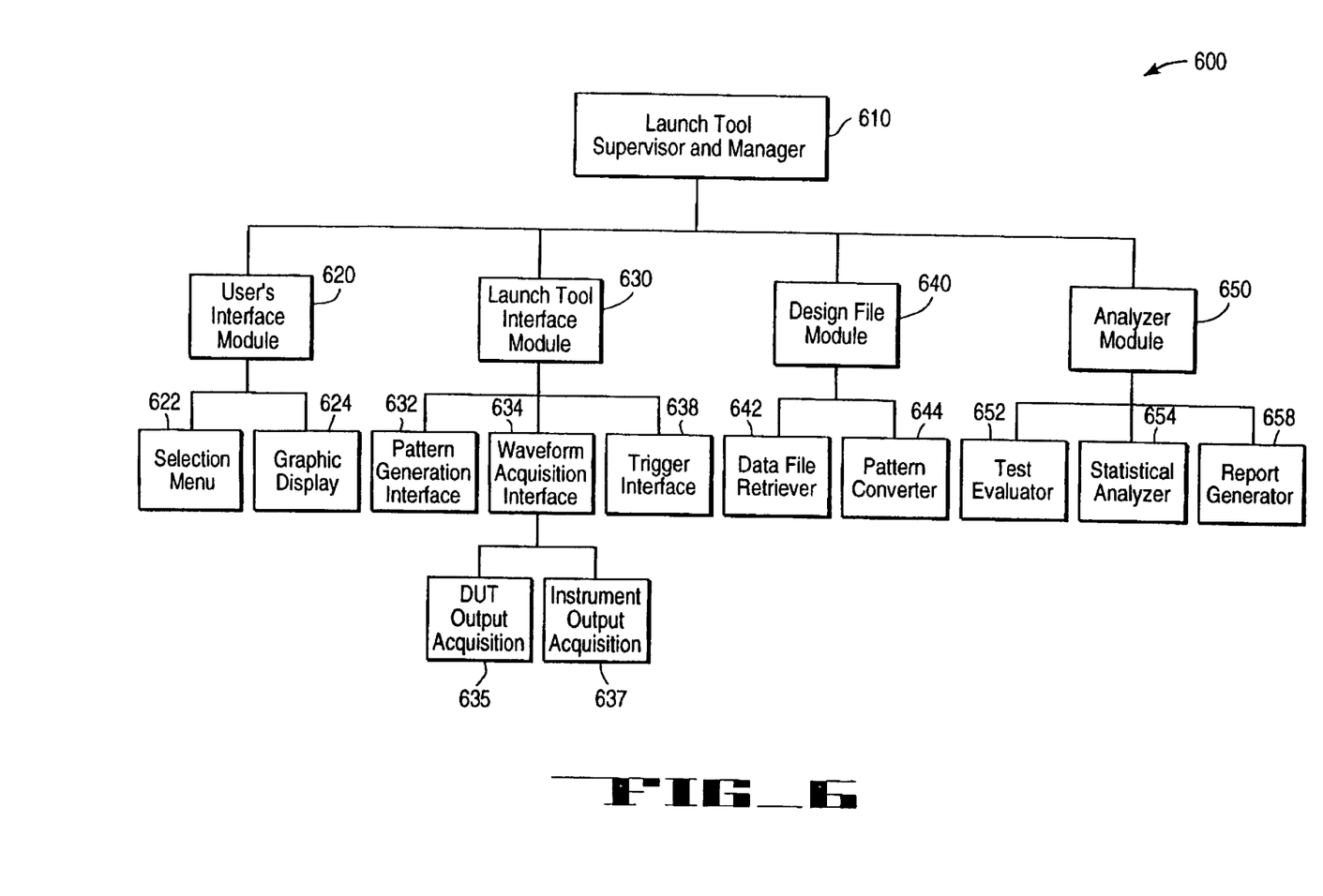
FIG. 6 is a diagram of one embodiment of a processing system.

Referring to FIG. 6, a diagram illustrating one embodiment of a processing system 600 to control the launch tool 20. The processing system 600 comprises a launch tool supervisor and manager 610. The processing system 600 is typically located in the computer system 100 and is typically realized as programs executed by the computer system 100.

The launch tool supervisor and manager 610 coordinates the operation and interactions of a user's interface module (UIM) 620, a launch tool interface module (LTIM) 630, a design file module (DFM) 640, and an analyzer module (AM) 650.

The UIM 620 provides an interface for the user. The UIM 620 comprises a selection menu 622 and graphic display 624. The selection menu 622 includes items to be selected by the user. Examples of these items include the specification of the design file to be downloaded, the configuration of the launch tool, etc. The graphic display 624 provides the visual display of test data. Some examples of the display include the test vectors, the captured waveforms from the DUT or the tester, and the comparison result of the captured waveform with highlighted differences.

The LTIM 630 provides the communication interface between the host computer system 100 and the hardware vector launch tool 20. The LTIM 630 includes a pattern generation interface (PGI) 632, a waveform acquisition interface (WAI) 634, and a trigger interface (TI) 638. The PGI 632 formats data from the design files to be downloaded to the PGU 30, and configures the communication protocol between the computer system 100 and the PGU 30 as shown in FIG. 1. The WAI 634 reads the test output data from the WAU 40 of FIG. 1. The WAI 634 includes a DUT output acquisition 635 and the instrument output acquisition 637. The DUT output acquisition 635 reads the data from the scan output of the DUT 60 via the DUT bus 42. The instrument output acquisition 637 reads the data from the signal acquisition instrument 70 via the signal acquisition bus 44.

The DFM 640 obtains the design files and converts the design file data into appropriate format to be downloaded to the PGU 30 as shown in FIG. 1. The DFM 640 includes a data file retriever 642 and a pattern converter 644. The data file retriever 642 imports the specified design file from the designer's storage location. In one embodiment, the data file retriever 642 downloads the design files from the network to which the designer's workstation is connected. The pattern converter 644 reads the retrieved design file and converts into proper format to fit in the test vector memory module in the PGU 30.

The AM 650 analyzes the test results as obtained from the WAI 634. The AM 650 includes a test evaluator 652, a statistical analyzer 654, and a report generator 656. The test evaluator 652 evaluates the test results by comparing the test output from the DUT 60 with the expected simulated data. To compensate for any propagation delays within the DUT 60, the expected simulated data may be time adjusted. Typical propagation delays may range from a few nanoseconds to tens of nanoseconds. In one embodiment, the test evaluator 652 compares expected simulated data with the test output from the DUT 60 or with the signal acquisition output from the signal acquisition instrument 70. The statistical analyzer 654 computes the statistics of the test results such as the frequency of errors at a particular internal node. The report generator 656 summarizes the results of the test evaluation and the statistical analysis and presents the test report to the designer.

These modules operate and interact to one another to control and manage the hardware vector launch tool 20. In one embodiment, these modules are realized by programs or functions executed by the host processor(s) in the computer system 100 of FIG. 2.

Figure 7:
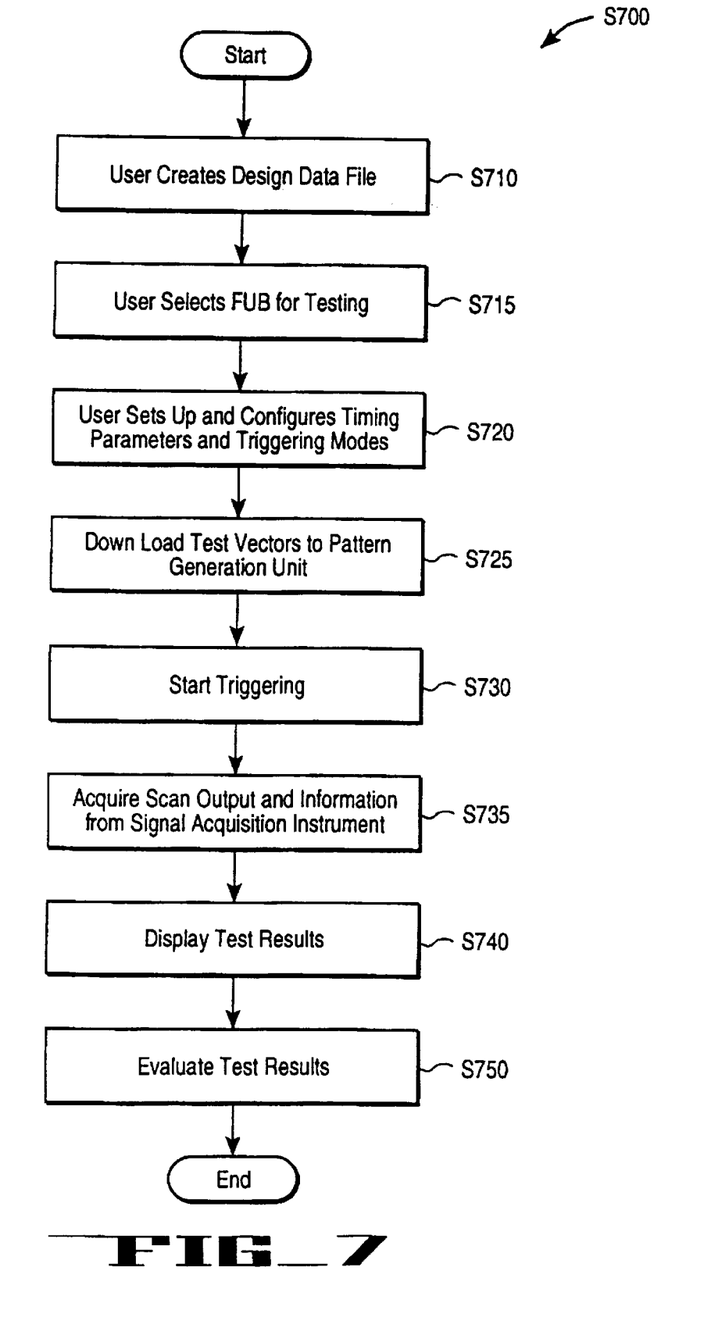
FIG. 7 is a flow diagram illustrating one embodiment of a system state.

Referring to FIG. 7, a flow diagram illustrating one embodiment of a system process S700 for the operation of the debug vector launch tool is shown.

At START, the system process S700 enters step S710. In step S710, the user, typically the designer of the particular functional unit block in the DUT 60, creates the design data file. There are a number of ways that the design data file is created. In one embodiment, the design data file includes vectors that correspond to some areas of concern in the DUT. The areas of concern are identified by a preliminary testing of the- device on the high volume manufacturing (HVM) production tester. In another embodiment, the design data file is created by the design engineer specifically to debug a suspected FUB. From this design data file, it is expected that test vectors can be generated as the stimuli to verify the functionality of the relevant FUB. The system process S700 then goes to step S715. In step S715, the user selects the functional block unit for testing by hooking up the probes of the PGU 30 to the appropriate test points which correspond to the internal nodes of the DUT 60.

The system process then enters step S720. In step S720, the user sets up and configures timing parameters and triggering modes to prepare for a debug or test session. In this step, the user may also configure the signal acquisition instrument 70 and sets up the communication channels between the DUT 60 and the signal acquisition instrument 70. The system process then goes to step S725 to download the test vectors as generated from the retrieved design data file to the PGU 30. After the test vectors are downloaded, the system process enters step S730 to start triggering the launch tool, the DUT, and the signal acquisition instrument if necessary.

The system process S700 then goes to step S735 to acquire the scan output from the DUT 60 and the signal acquisition output from the signal acquisition instrument 70 if necessary. Essentially, this step is performed by the WAI 634 shown in FIG. 6. The system process S700 then goes to step S740 to display the test results by invoking the graphic display module 624 and the test evaluator 652 as shown in FIG. 2. The test results are then evaluated in step S750. The system process S700 is then terminated.

Thus, the present invention discloses a method and system to debug and test the design at the early phase of the manufacturing cycle in an inexpensive manner. The present invention simplifies the development and manufacturing process without involving a significant amount of overhead in terms of time and money as usually demanded by traditional tester.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A debug tool to provide a test vector to a device under test, the debug tool comprising:
   a pattern generator unit coupled to the device under test to transmit the test vector to the device under test, the pattern generator unit generating a master triggering signal;
   a waveform acquisition unit coupled to the device under test to receive a first test output from the device under test, the first test output being generated by the device under test in response to the transmitted test vector; and
   a trigger unit coupled to the pattern generator unit, the waveform acquisition unit, and the device under test to synchronize the pattern generator unit, the waveform acquisition unit, and the device under test using one of the mastering triggering signal and a synchronizing signal from the device under test.

2. The debug tool of claim 1 further comprises:
   a processor coupled to the pattern generator unit, the waveform acquisition unit, and the trigger unit to perform a control function on the pattern generator unit, the waveform acquisition unit, and the trigger unit.

3. The debug tool of claim 2 wherein the pattern generator unit comprises a test vector memory to store the test vector.

4. The debug tool of claim 2 wherein the waveform acquisition unit further receives a second test output, the second test output being generated by a signal acquisition instrument, the signal acquisition instrument being coupled to the device under test.

5. The debug tool of claim 4 wherein the waveform acquisition unit further comprises:
   a capture and logic circuit to capture one of the first and second test outputs and produce a digital word representative of one of the first and second test outputs; and
   an acquisition memory module coupled to the capture and logic circuit to store the digital word.

6. The debug tool of claim 5 wherein the capture and logic circuit further comprises:
   a sample-and-hold device to sample and hold one of the first and second test outputs; and
   an analog-to-digital converter coupled to the sample-and-hold device to convert the one of the first and second test outputs to the digital word.

7. The debug tool of claim 5 wherein the capture and logic circuit further comprises:
   a logic circuit to perform a plurality of logic functions on the first and second test outputs.

8. The debug tool of claim 2 wherein the trigger unit further comprises a frequency generator to generate a synchronizing signal based on a signal specification.

9. The debug tool of claim 8 wherein the control function is one of a downloading of the test vector from a design file to the test vector memory module, a generation of the signal specification, and a reading of the captured first and second test outputs.

10. The debug tool of claim 8 wherein the frequency generator operates at 1 GHz.

11. A system to provide a test vector to a device under test, the system comprising:
    a host processor;
    a memory coupled to the host processor, the memory containing program instructions executed by the host processor; and
    a debug tool coupled to the host processor, the debugging tool comprising:
       a pattern generator unit coupled to the device under test to transmit the test vector to the device under test, the pattern generator unit generating a master triggering signal,
       a waveform acquisition unit coupled to the device under test to receive a first test output from the device under test, the first test output being generated by the device under test in response to the transmitted test vector, and
       a trigger unit coupled to the pattern generator unit, the waveform acquisition unit, and the device under test to synchronize the pattern generator unit, the waveform acquisition unit, and the device under test using one of the mastering triggering signal and a synchronizing signal from the device under test.

12. The system of claim 11 wherein the waveform acquisition unit further receives a second test output, the second test output being generated by a signal acquisition instrument, the signal acquisition instrument being coupled to the device under test.

13. The system of claim 11 wherein the waveform acquisition unit further comprises:
    a capture and logic circuit to capture one of the first and second test outputs and produce a digital word representative of one of the first and second test outputs; and an acquisition memory module coupled to the capture and logic circuit to store the digital word.

14. The system of claim 13 wherein the program instructions executed by the host processor read the digital word.

15. The system of claim 15 wherein the digital word is compared with a simulated output.

16. The system of claim 11 wherein the program instructions executed by the host processor control an operation of the debug tool.

17. A method for providing a test vector to a device under test, the method comprising the steps of:

transmitting the test vector to the device under test by a pattern generator unit;

generating a master triggering signal to a trigger unit;

receiving a first test output from the device under test by a waveform acquisition unit, the first test output being generated by the device under test in response to the transmitted test vector; and synchronizing the pattern generator unit, the waveform acquisition unit, and device under test using one of the mastering triggering signal and a synchronizing signal from the device under test.

18. The method of claim 17, prior to transmitting the test vector, further comprises:

downloading the test vector from a design file; and storing the test vector in a test vector memory module in the pattern generator unit.

19. The method of claim 17 further comprises comparing the first test output with a simulated output.

20. The method of claim 19 wherein the simulated output is time adjusted to compensate for a delay caused by the device under test.

* * * * *